United States Patent
Heijna

(10) Patent No.: US 11,563,422 B2
(45) Date of Patent: Jan. 24, 2023

(54) FILTER CIRCUIT WITH A NOTCH FILTER

(71) Applicant: RF360 EUROPE GMBH, Munich (DE)

(72) Inventor: Roeland Heijna, Well (NL)

(73) Assignee: RF360 EUROPE GMBH, Munich (DE)

(*) Notice: Subject to any disclaimer, the term of this patent is extended or adjusted under 35 U.S.C. 154(b) by 71 days.

(21) Appl. No.: 16/965,826

(22) PCT Filed: Jan. 28, 2019

(86) PCT No.: PCT/EP2019/051976
§ 371 (c)(1),
(2) Date: Jul. 29, 2020

(87) PCT Pub. No.: WO2019/154655
PCT Pub. Date: Aug. 15, 2019

(65) Prior Publication Data
US 2021/0058067 A1   Feb. 25, 2021

(30) Foreign Application Priority Data

Feb. 8, 2018  (DE) .................. 10 2018 102 832.6

(51) Int. Cl.
*H04B 1/04*   (2006.01)
*H03F 3/24*   (2006.01)
(Continued)

(52) U.S. Cl.
CPC ........... *H03H 9/6409* (2013.01); *H03F 3/245* (2013.01); *H03H 9/145* (2013.01); *H03H 9/25* (2013.01);
(Continued)

(58) Field of Classification Search
None
See application file for complete search history.

(56) References Cited

U.S. PATENT DOCUMENTS 6,420,946 B1 * 7/2002 Bauer ............... H03H 9/14547
333/195
7,679,474 B2 * 3/2010 Igaki .................. H03H 9/6483
333/195
(Continued)

FOREIGN PATENT DOCUMENTS

JP   H04 132409 A   5/1992
KR   100 860 509 B1  9/2008
(Continued)

OTHER PUBLICATIONS

International Search Report and Written Opinion dated Apr. 25, 2019 corresponding to Application No. PCT/EP2019/051976.

*Primary Examiner* — Pablo N Tran
(74) *Attorney, Agent, or Firm* — Patterson+ Sheridan, L.L.P.

(57) ABSTRACT

A filter circuit comprises in a signal line a band filter (BF) allowing to let pass a useful frequency band and a notch filter (NF) circuited in series to the band filter for filtering out a stop band frequency. The notch filter comprises a series circuit of a number of parallel shunt elements (SE1 . . . SE6) wherein each shunt element is shifted infrequency against the other shunt elements that the frequencies thereof are distributed (f1 . . . F6) over a notch band. All shunt elements may be realized as a SAW one-port resonator ($TR_{NF}$) including regions with different pitches.

12 Claims, 3 Drawing Sheets

(51) Int. Cl.
  *H03H 9/64*   (2006.01)
  *H03H 9/25*   (2006.01)
  *H03H 9/145*  (2006.01)
  *H04B 1/10*   (2006.01)

(52) U.S. Cl.
  CPC ......... *H04B 1/0475* (2013.01); *H04B 1/1027* (2013.01); *H03F 2200/451* (2013.01); *H04B 2001/1063* (2013.01)

(56) References Cited

U.S. PATENT DOCUMENTS

| | | | |
|---|---|---|---|
| 2004/0130411 A1 | 7/2004 | Beaudin et al. | |
| 2008/0258983 A1* | 10/2008 | Bauer | H03H 9/6493 343/722 |
| 2010/0109802 A1* | 5/2010 | Tanaka | H03H 9/725 333/195 |
| 2011/0102107 A1 | 5/2011 | Onzuka | |
| 2012/0188026 A1* | 7/2012 | Yamaji | H03H 9/6483 333/133 |
| 2012/0306595 A1* | 12/2012 | Omote | H03H 9/6433 333/195 |
| 2014/0035702 A1 | 2/2014 | Black et al. | |
| 2014/0070906 A1* | 3/2014 | Ikeuchi | H03H 9/643 333/195 |
| 2015/0130680 A1* | 5/2015 | Link | H03H 7/38 343/852 |
| 2018/0241373 A1 | 8/2018 | Yamada | |
| 2018/0367121 A1 | 12/2018 | Yamada | |

FOREIGN PATENT DOCUMENTS

| | | |
|---|---|---|
| WO | 2017/073652 A1 | 5/2017 |
| WO | 2017/149878 A1 | 9/2017 |

\* cited by examiner $d1 \neq dx \neq dn$

FILTER CIRCUIT WITH A NOTCH FILTER

CROSS-REFERENCE TO RELATED APPLICATIONS

This application is a national stage application under 35 U.S.C. 371 of PCT/EP2019/051976, filed Jan. 28, 2019, which claims the benefit of German Application No. 10 2018 102 832.6, filed Feb. 8, 2018, both of which are incorporated herein by reference in their entireties.

In cellular communications a system consisting of a PA, PA-matching and TX filter (e.g., a SAW duplexer) or in a respective frontend modules the isolation within the stop band may be too bad to comply with given specification of a specified frequency band. Hence additional measures have to be taken to improve the isolation between different bands.

A known method for doing so is to include a notch filter in the signal path that filters out a specific frequency to create a pole in the filter transfer function. Usually one notch filter is filtering out just one single frequency and is thus useful for attenuating just one spurious signal and improves the isolation at one specific frequency only. Introducing any further notch would unduly enhance the series resistance thereby producing losses what is not desired.

It is an object of the invention to improve the isolation between different frequency bands that are operating simultaneous in standard frontend modules without causing too much additional loss.

This and other objects are met by a filter circuit according to claim 1. Further embodiments including advantageous features are given by dependent claims.

The idea is to provide a notch filter for filtering out a stop band frequency. The notch filter is circuited in series to a band filter and comprises a series circuit of a number of parallel shunt elements. The shunt elements are mutually shifted in frequency and hence, provide a number stop band frequencies that are distributed over a notch band. This results in a notch filter having a broad notch band according to the distribution of the single stop band frequencies.

None of the shunt element needs or does provide a substantial pole in the transfer function of the filter for sufficiently for filtering out a stop band frequency. However the sum of the small shunt elements, each of them providing a small notch, yields an improved isolation over a substantial broad band. It is possible to adjust the isolation by setting a proper admittance for each shunt element and by selecting a useful number and distribution of shunt elements.

The total admittance of the notch filter is selected and set at a value comparable to that of a known shunt element but is distributed over the number of shunt elements. Hence, the total additional impedance added by the notch filter is only small and does not extend the impedance of a known notch filter e.g. realized by a single shunt element.

As preferred shunt element resonators can be used that are circuited in parallel to the signal line. Any kind of resonator is possible. Preferred resonators are realized in the same technology like the filter circuit. Preferred shunt elements are chosen from resonators operating with acoustic waves. If the band filter is a SAW filter the resonator may be a SAW resonator. Accordingly BAW resonators and LC resonators may be used in the case of BAW filters or LC filters respectively.

According to an embodiment the parallel shunt elements comprise a one-port SAW resonator. More preferably the notch filter comprise a single one-port SAW resonator only having a transducer with two bus bars and a number of transducer fingers alternatingly connected to one of the two bus bars. A finger distance between the centers of two adjacent transducer fingers defines a stop band frequency within the notch band. In the one-port resonator there are provided a number of different finger distances each providing a shunt elements with a respective stop band frequency.

Each of the shunt elements is comprised by a low number of fingers only.

According to a preferred embodiment each finger distance is present only once in the single one-port resonator. Hence, each pair of adjacent fingers has a different distance.

The filter circuit may comprise acoustic filters like SAW or BAW filters. The acoustic filters may be part a duplexer, diplexer or a higher multiplexer like a quadplexer.

The band filter may be a band pass, a high pass or a low pass. A preferred application of the filter circuit is a Tx filter, e.g. within a duplexer that needs an improved Rx isolation. Here the notch filter is set to a notch band centered at the according Rx frequencies that are usually located in a neighbored band.

The band filter may comprise a DMS filter, a reactance filter in a ladder type or lattice type arrangement, an LC filter or a hybrid filter that combines two partial filters using different technologies.

The filter circuit can be used in a wireless fronted module for cellular mobile devices e.g. a wireless Power RF PAMiD fronted module. With the filter circuit used in such module it is possible to adjust a TX RX notch filter element in such a way that the total RX isolation in the system is maximum.

Within the PAMiD fronted module the notch band can be centered at the useful frequency band of a respective other filter circuit comprised in and operated by the frontend module. Alternatively the other filter circuit may be a separate circuit operating together with the PAMiD fronted module.

In the following the filter circuit is explained in more detail by reference to specific embodiments and the accompanied figures. The figures are schematic only and not to scale.

FIG. 1A shows a known filter circuit according to the art comprising a band filter BF, and a notch filter NF circuited in series within a signal line SL. The band filter BF may be embodied as a band pass filter. The notch filter N comprises a shunt element SE circuited in parallel to the signal line SL. As shown in FIG. 1B the notch filter may comprise a one-port SAW resonator R having a resonance frequency $f_0$. Due to circuiting the resonator R as a shunt element resonance frequency $f_0$ complies with a single stop band frequency.

Figure 1:
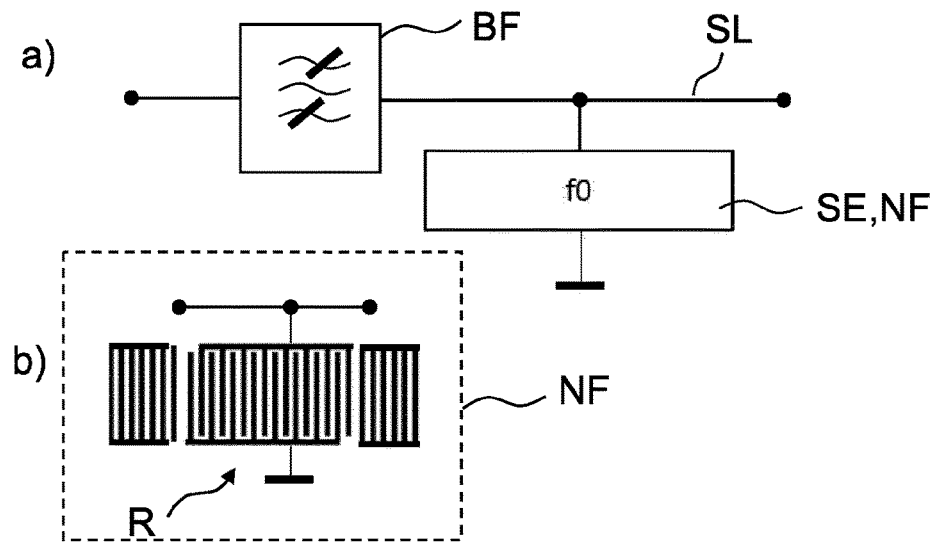
FIG. 1 shows a filter circuit of the art.
Figure 2:
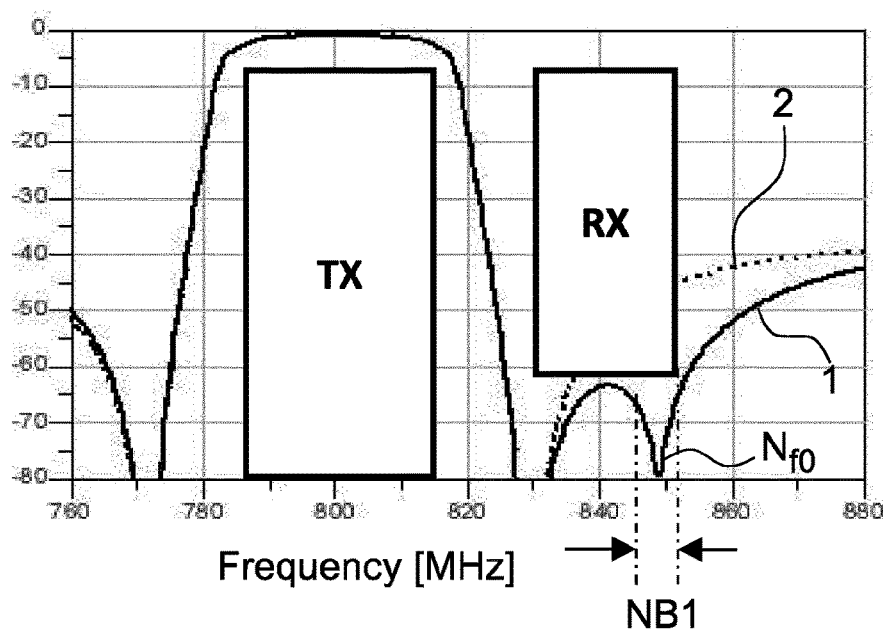
FIG. 2 shows the transfer curve of the filter circuit of FIG. 1.

FIG. 2 shows the transfer curve of the filter circuit of FIG. 1. In the example the band pass filter BF is a Tx filter and the pass band complies with the Tx band. The respective Rx band is located above the Tx band. In the figure the required Rx isolation of the Tx filter is depicted as rectangle. Graph 1 of FIG. 2 shows the transfer curve and the dotted line of graph 2 depicts a transfer curve of the same filter circuit but without a notch filter. It is shown that curve 2 is unsatisfactory and the required isolation like in curve 1 can only be achieved with a notch filter NF. However, the isolation below the pole created by the stop band frequency $f_0$ of the notch could possibly be improved.

Figure 3:
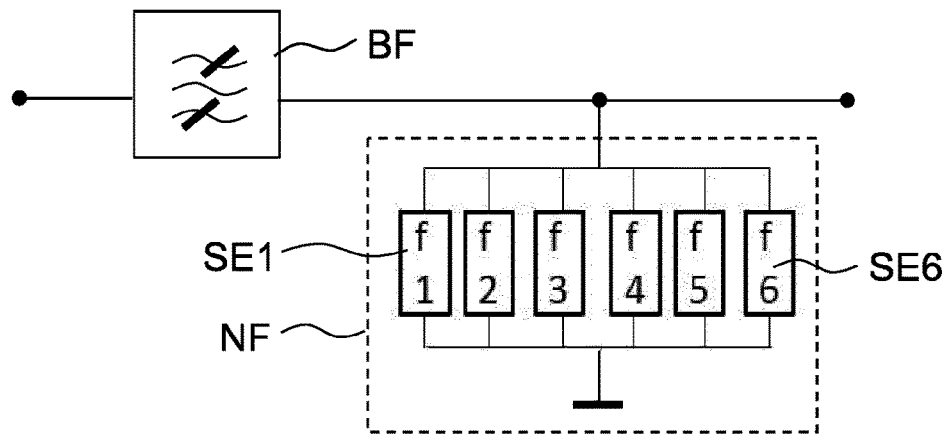
FIG. 3 shows a filter circuit according to an embodiment.
Figure 4A:
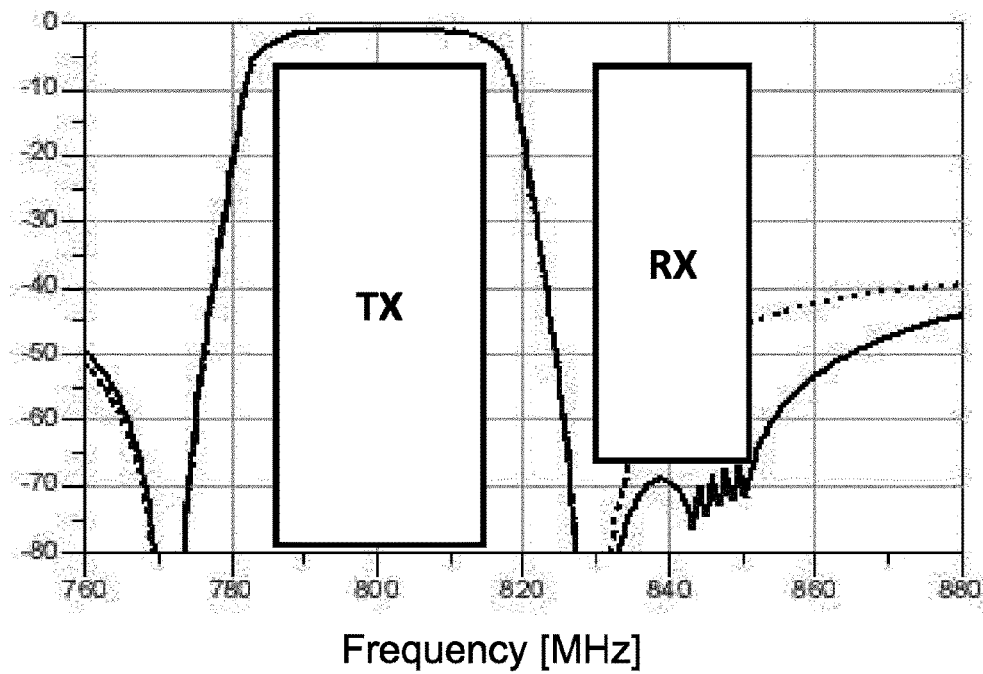
FIGS. 4A and 4B show the transfer curve of the filter circuit of FIG. 3.
Figure 4B:
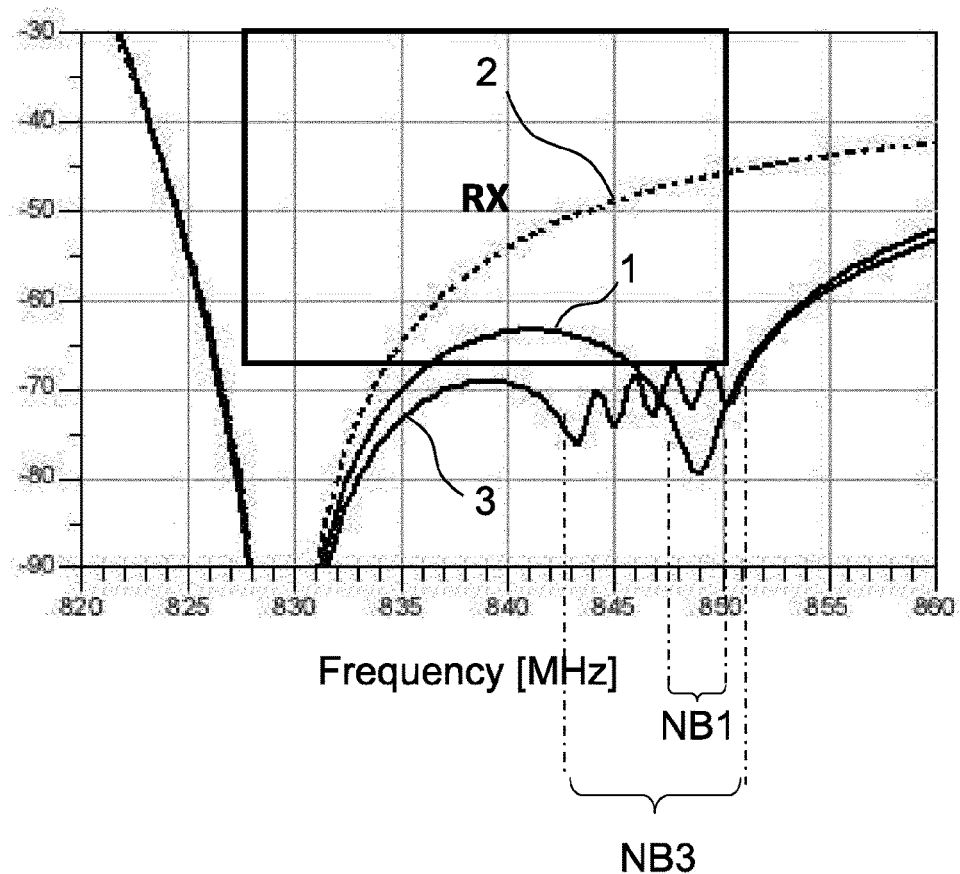

FIG. 3 shows a filter circuit according to an embodiment of the invention. The filter circuit comprises a band filter BF, and a notch filter NF circuited in series within a signal line SL. Different to FIG. 1 the presented notch filter NF comprises a series of parallel shunt elements S1 to S6. Each of the shunt elements is assigned to a different stop band frequency f1 to f6. The notch filter can be construed by a series of small notches of low admittance each of which would be insufficient to create a useful pole in the transfer curve (admittance curve S21). However, when circuited together in parallel the total notch filter NF creates broad notch band NB3 as can be seen from curve 3 in FIG. 4B that is an enlarged cut-out of FIG. 4A in the Rx region. For reference only depicted curve 1 complies with a curve 1 achieved from a filter circuit according to FIG. 1 and shown in FIG. 2. As can be seen a new notch band NB3 is created being broader than the pole $N_{f0}$ according to a "notch band" NB1 as achieved by a known filter according to FIG. 1.

Curve 3 shows an improved isolation at frequencies below the pole of curve 1 according to the art. Thereby the isolation for the whole Rx band is improved as the maximum of the attenuation curve 1 (worst attenuation) is higher (worse) than the maximum of the attenuation curve 3. As a result the high attenuation of a single pole originating from a notch filter of the art is diminished if favor of broad attenuation with no disturbing maximum.

Figure 5:
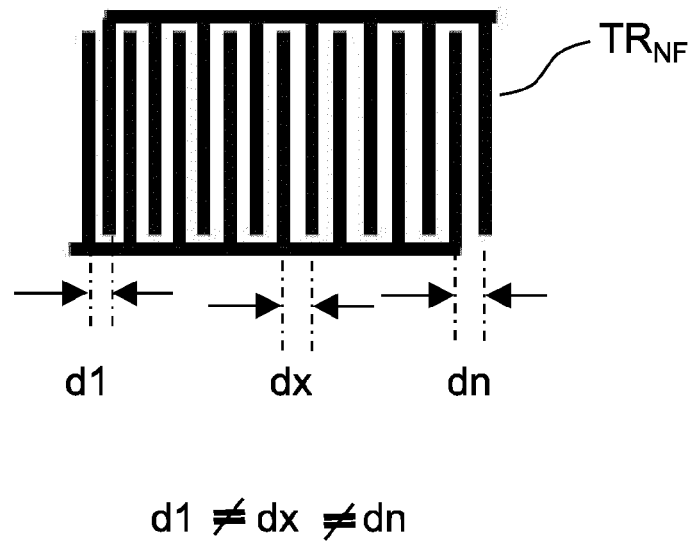
FIG. 5 shows a transducer that can be used as a shunt resonator in the embodiment of FIG. 3.

FIG. 5 shows a transducer $TR_{NF}$ of a SAW one-port resonator R that can be used as a notch filter NF in the embodiment of the filter circuit of FIG. 3. The transducer has two bus bars with interdigitated transducer fingers alternatingly connected to the two bus bars. Each two adjacent transducer finger have a center to center finger distance d. The transducer $TR_{NF}$ comprises a series of n different finger distances d1 to dn and each occurring finger distance is assigned to a respective stop band frequency of the notch filter NF and creates a small pole in the transfer curve. The finger distances d1 to dn and the according stop band frequency thereof are mutually shifted by the same amount and hence are uniformly distributed.

Figure 6:
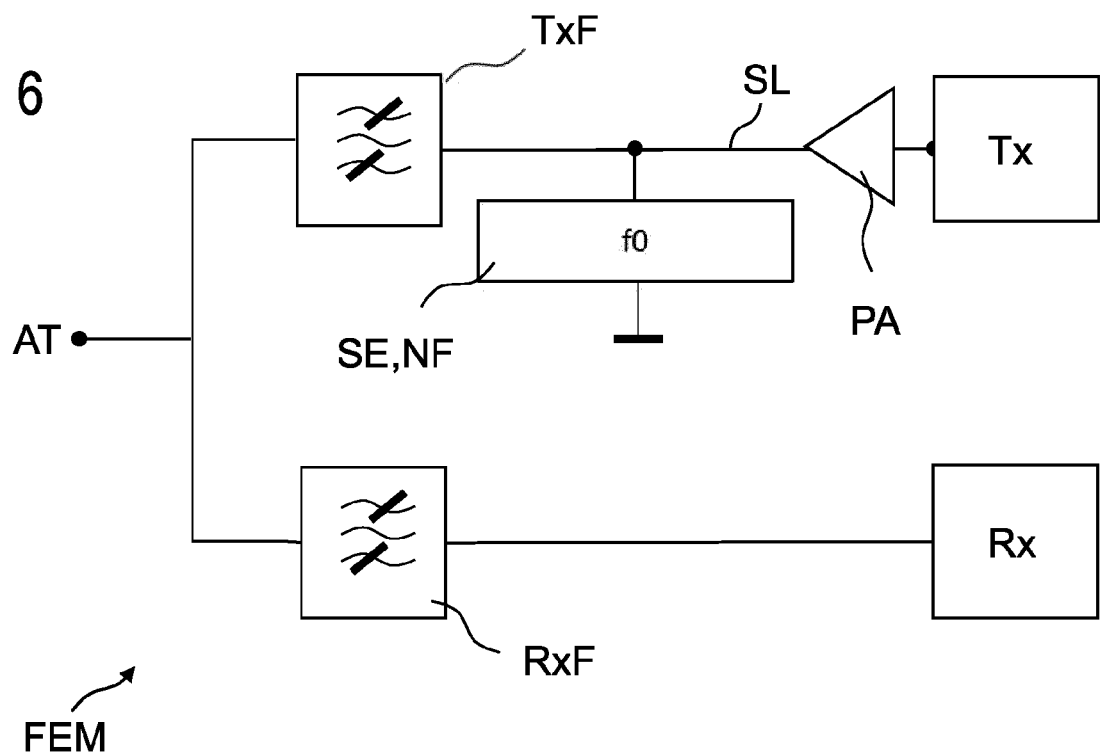
FIG. 6 shows a frontend module comprising a filter circuit according to FIG. 3.

FIG. 6 shows a frontend module FEM comprising a filter circuit according to FIG. 3. Here, the band filter is embodied as a Tx filter TxF of a duplexer. The according Rx filter RxF is connected with the Tx filter TxF to form a duplexer operating in the according Rx and Tx band. The notch filter NF is placed between power amplifier PA and Tx filter TxF.

LIST OF USED TERMS AND REFERENCE SYMBOLS

BF band filter
d1, dx, dn finger distances between the centers of two adjacent transducer fingers
$f_0$ stop band frequency of single notch filter
$f_1$ to $f_6$ stop band frequencies of SE1 to SE6
FEM PAMiD frontend module
N notch
NB notch band
NF notch filter
PA power amplifier
R one port SAW resonator
R resonator
RxF Rx filter
SE1 to SE6 shunt elements
SL signal line
TR transducer having
TxF Tx filter
1
2 admittance of a common filter
3 admittance of a
band pass filter
bus bars
duplexer or multiplexer
filter circuit
further filter circuit
matching circuit
neighbored band
parallel shunt elements
stop band frequency
useful frequency band

The invention claimed is:

1. A filter circuit comprising, in a signal line:
a band filter allowing to let pass a frequency band; and
a notch filter circuited in series to the band filter for filtering out a stop band frequency, wherein the notch filter comprises:
a single surface-acoustic-wave (SAW) resonator having a transducer with two bus bars and a number of transducer fingers alternatingly connected to one of the two bus bars, wherein:
a finger distance between a center of two adjacent transducer fingers defines a portion of the stop band frequency within a notch band,
the transducer of the SAW resonator comprises a number of different finger distances between elements with respective stop band frequencies,
each shunt element of the number of different parallel shunt elements is shifted in frequency against the other shunt elements such that the respective stop band frequencies are distributed over the notch band, and
the notch filter provides the notch band.

2. The filter circuit of claim 1, wherein the parallel shunt elements are chosen from resonators circuited in parallel to the signal line, and wherein each shunt element has a small admittance of about 1/n times the admittance of a normal notch filter where n is the number of shunt elements.

3. The filter circuit of claim 1, wherein the parallel shunt elements are chosen from resonators operating with acoustic waves.

4. The filter circuit of claim 1, wherein the transducer comprises each finger distance only one time.

5. The filter circuit of claim 1, wherein the SAW resonator is a one-port SAW resonator.

6. A power amplifier module integrated duplexer (PAMiD) frontend module, comprising:
a filter circuit comprising, in a signal line;
a band filter allowing to let pass a frequency band; and
a notch filter circuited in series to the band filter for filtering out a stop band frequency, wherein the notch filter comprises:
a single surface-acoustic-wave (SAW) resonator having a transducer with two bus bars and a number of transducer fingers alternatingly connected to one of the two bus bars, wherein:
a finger distance between a center of two adjacent transducer fingers defines a portion of the stop band frequency within a notch band,
the transducer of the SAW resonator comprises a number of different finger distances between transducer fingers of the transducer defining a number of different parallel shunt elements with respective stop band frequencies, each shunt element of the number of different parallel shunt elements is shifted in frequency against the other shunt elements such that the respective stop band frequencies are distributed over the notch band, and the notch filter provides the notch band, and a power amplifier and a matching circuit, wherein a further filter circuit operating in a neighboring band is part of the PAMiD frontend module or a different device operating together with the PAMiD frontend module and wherein the notch band is centered on the neighboring band.

7. The PAMiD frontend module of claim 6, wherein the filter circuit and the further filter circuit are band pass filters and are part of a duplexer or a multiplexer, and wherein the notch band assigned to the filter circuit is centered at the frequency band of the respective other filter circuit of the duplexer or multiplexer.

8. The PAMiD frontend module of claim 6, wherein the filter circuit is a transmitter filter of a duplexer wherein the notch band complies with the frequency band of a receiver filter of the same duplexer.

9. The PAMiD frontend module of claim 6, wherein the SAW resonator is a one-port SAW resonator.

10. The PAMiD frontend module of claim 6, wherein the parallel shunt elements are chosen from resonators circuited in parallel to the signal line, and wherein each shunt element has a small admittance of about 1/n times the admittance of a normal notch filter where n is the number of shunt elements.

11. The PAMiD frontend module of claim 6, wherein the parallel shunt elements are chosen from resonators operating with acoustic waves.

12. The PAMiD frontend module of claim 6, wherein the transducer comprises each finger distance only one time.

* * * * *